(12) United States Patent
Yang

(10) Patent No.: US 8,273,650 B2
(45) Date of Patent: Sep. 25, 2012

(54) METHOD OF FABRICATING THIN FILM INTERFACE FOR INTERNAL LIGHT REFLECTION AND IMPURITIES ISOLATION

(75) Inventor: Tsun-Neng Yang, Taipei (TW)

(73) Assignee: Atomic Energy Council—Institute of Nuclear Energy Research, Lungtan, Taoyuan (TW)

( * ) Notice: Subject to any disclaimer, the term of this patent is extended or adjusted under 35 U.S.C. 154(b) by 343 days.

(21) Appl. No.: 12/618,862

(22) Filed: Nov. 16, 2009

(65) Prior Publication Data

US 2010/0267223 A1    Oct. 21, 2010

(30) Foreign Application Priority Data

Apr. 16, 2009  (TW) ................................ 098112603

(51) Int. Cl.
*H01L 21/44* (2006.01)
(52) U.S. Cl. .................. 438/607; 438/584; 438/597
(58) Field of Classification Search .................. 438/503, 438/584, 597, 607
See application file for complete search history.

(56) References Cited

U.S. PATENT DOCUMENTS

| 3,961,997 | A | * | 6/1976 | Chu | 438/97 |
|---|---|---|---|---|---|
| 4,253,882 | A | * | 3/1981 | Dalal | 136/249 |
| 4,377,723 | A | * | 3/1983 | Dalal | 136/249 |
| 4,496,788 | A | * | 1/1985 | Hamakawa et al. | 136/249 |
| 4,598,164 | A | * | 7/1986 | Tiedje et al. | 136/249 |
| 4,923,524 | A | * | 5/1990 | Kiss | 136/250 |
| 5,324,364 | A | * | 6/1994 | Matsuda et al. | 136/249 |
| 5,437,734 | A | * | 8/1995 | Matsushita et al. | 136/249 |
| 6,072,117 | A | * | 6/2000 | Matsuyama et al. | 136/256 |
| 6,184,456 | B1 | * | 2/2001 | Matsuyama et al. | 136/256 |
| 6,224,736 | B1 | * | 5/2001 | Miyamoto | 205/97 |
| 6,329,296 | B1 | * | 12/2001 | Ruby et al. | 438/712 |
| 6,346,184 | B1 | * | 2/2002 | Sano et al. | 205/199 |
| 6,379,521 | B1 | * | 4/2002 | Nishio | 205/98 |
| 6,521,827 | B2 | * | 2/2003 | Tsukuda et al. | 136/261 |
| 6,576,112 | B2 | * | 6/2003 | Sonoda et al. | 205/155 |
| 6,592,739 | B1 | * | 7/2003 | Sonoda et al. | 205/141 |
| 6,613,603 | B1 | * | 9/2003 | Sano | 438/72 |
| 6,690,027 | B1 | * | 2/2004 | Bensahel et al. | 257/14 |
| 6,728,281 | B1 | * | 4/2004 | Santori et al. | 372/45.01 |
| 6,733,650 | B2 | * | 5/2004 | Sonoda et al. | 205/141 |
| 6,743,974 | B2 | * | 6/2004 | Wada et al. | 136/255 |
| 6,768,175 | B1 | * | 7/2004 | Morishita et al. | 257/352 |
| 6,927,444 | B2 | * | 8/2005 | Park et al. | 257/306 |
| 6,946,029 | B2 | * | 9/2005 | Tsukuda et al. | 117/16 |
| 7,071,489 | B2 | * | 7/2006 | Tsukuda | 257/75 |
| 7,282,132 | B2 | * | 10/2007 | Iwata et al. | 205/199 |
| 7,326,587 | B2 | * | 2/2008 | Park et al. | 438/57 |
| 7,858,427 | B2 | * | 12/2010 | Rana | 438/64 |
| 7,943,416 | B2 | * | 5/2011 | Scherff et al. | 438/94 |
| 7,955,433 | B2 | * | 6/2011 | Kirscht et al. | 117/83 |
| 7,972,584 | B2 | * | 7/2011 | Blencoe | 423/350 |
| 8,012,851 | B2 | * | 9/2011 | Henley et al. | 438/458 |
| 8,035,028 | B2 | * | 10/2011 | Moslehi | 136/255 |
| 2005/0230732 | A1 | * | 10/2005 | Park et al. | 257/296 |

(Continued)

*Primary Examiner* — Thao Le
*Assistant Examiner* — Eric Jones
(74) *Attorney, Agent, or Firm* — Jackson IPG PLLC

(57) ABSTRACT

A high-quality epitaxial silicon thin layer is formed on an upgraded metallurgical grade silicon (UMG-Si) substrate. A thin film interface is fabricated between the UMG-Si substrate and the epitaxial silicon thin layer. The interface is capable of internal light reflection and impurities isolation. With the interface, photoelectrical conversion efficiency is improved. Thus, the present invention is fit to be applied for making solar cell having epitaxial silicon thin layer.

7 Claims, 5 Drawing Sheets

U.S. PATENT DOCUMENTS

Figure 1:
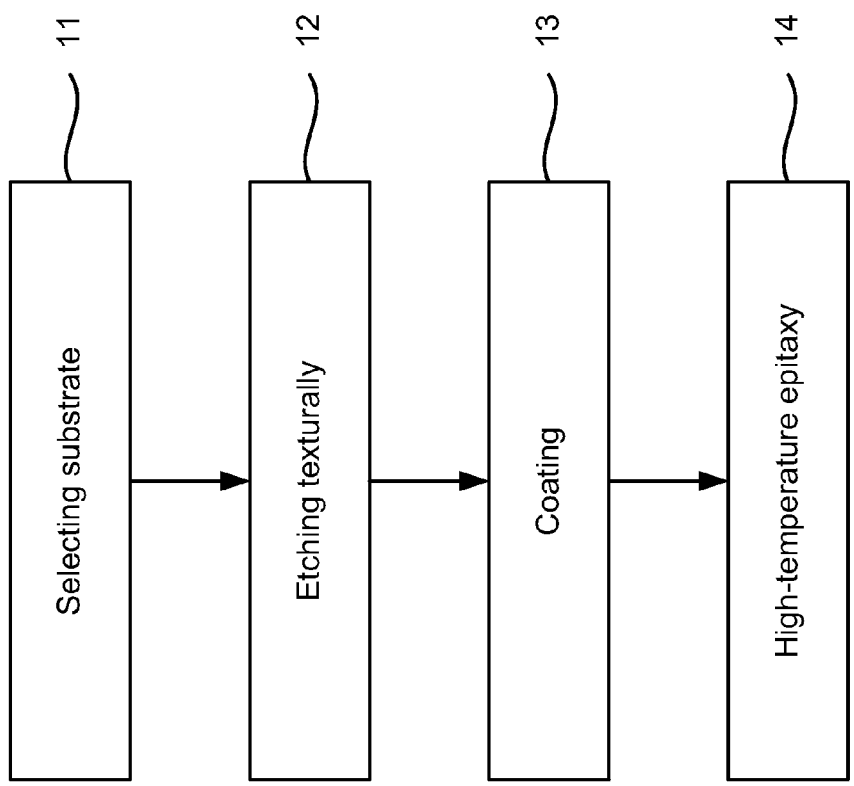

| | | | |
|---|---|---|---|
| 2007/0134901 A1* | 6/2007 | Chang et al. | 438/604 |
| 2007/0259130 A1* | 11/2007 | Von Kaenel et al. | 427/569 |
| 2008/0067499 A1* | 3/2008 | Maa et al. | 257/15 |
| 2008/0085587 A1* | 4/2008 | Wells et al. | 438/455 |
| 2008/0142853 A1* | 6/2008 | Orlowski | 257/287 |
| 2008/0178793 A1* | 7/2008 | Heuer et al. | 117/9 |
| 2009/0016666 A1* | 1/2009 | Kuo et al. | 385/2 |
| 2009/0242869 A1* | 10/2009 | Hovel et al. | 257/13 |
| 2010/0158782 A1* | 6/2010 | Blencoe | 423/335 |
| 2010/0163100 A1* | 7/2010 | Goya et al. | 136/255 |
| 2011/0084308 A1* | 4/2011 | Loh et al. | 257/190 |
| 2011/0302963 A1* | 12/2011 | Tathgar | 65/66 |

* cited by examiner

METHOD OF FABRICATING THIN FILM INTERFACE FOR INTERNAL LIGHT REFLECTION AND IMPURITIES ISOLATION

FIELD OF THE INVENTION

The present invention relates to fabricating a thin film interface; more particularly, relates to fabricating a thin film interface for internal light reflection and impurities isolation fit for an epitaxial silicon thin film solar cell having low cost and high efficiency.

DESCRIPTION OF THE RELATED ARTS

An electrochemical method can be used to form a porous structure on surface of a substrate made of upgraded metallurgical grade silicon (UMG-Si) for obtaining an internal reflective layer owing to different reflective indexes between silicon and the pores (just like air). Furthermore, surface of the pores traps metal impurities from within the UMG-Si substrate for avoid further diffusion into a high quality epitaxial silicon layer. However, chemical methods are used and chemical wastes are produced, which may cause harm to environment. Hence, the prior art does not fulfill all users' requests on actual use.

SUMMARY OF THE INVENTION

The main purpose of the present invention is to fabricate a thin film interface for internal light reflection and impurities isolation fit for an epitaxial silicon thin film solar cell having low cost and high efficiency.

The second purpose of the present invention is to obtain the thin film interface for inhibiting metal impurities in a substrate from diffusing into a high quality epitaxial silicon layer and for acting as an internal reflection layer for improving photoelectrical conversion efficiency.

To achieve the above purposes, the present invention is a method of fabricating a thin film interface for internal light reflection and impurities isolation, comprising steps of: (a) selecting a UMG-Si substrate having a purity ratio greater than 4N (99.99%); (b) through a physical method or a chemical method, forming a surface textured structure on a surface of the UMG-Si substrate; (c) through a physical method or a chemical method, coating a Ge metal thin layer and an amorphous silicon (a-Si) thin layer on UMG-Si substrate sequentially; and (d) processing an epitaxy through chemical vapor deposition (CVD) to form a high quality epitaxial silicon layer on the UMG-Si substrate, where a SiGe metal compound ($Si_{1-x}Ge_x$) thin film interface layer is obtained by the Ge metal thin layer and the a-Si thin layer between the UMG-Si substrate and the high quality epitaxial silicon layer; and an impurities aggregated area is obtained at interface between the UMG-Si substrate and the SiGe metal compound thin film interface layer. Accordingly, a novel method of fabricating a thin film interface for internal light reflection and impurities isolation is obtained.

BRIEF DESCRIPTIONS OF THE DRAWINGS

Figure 2:
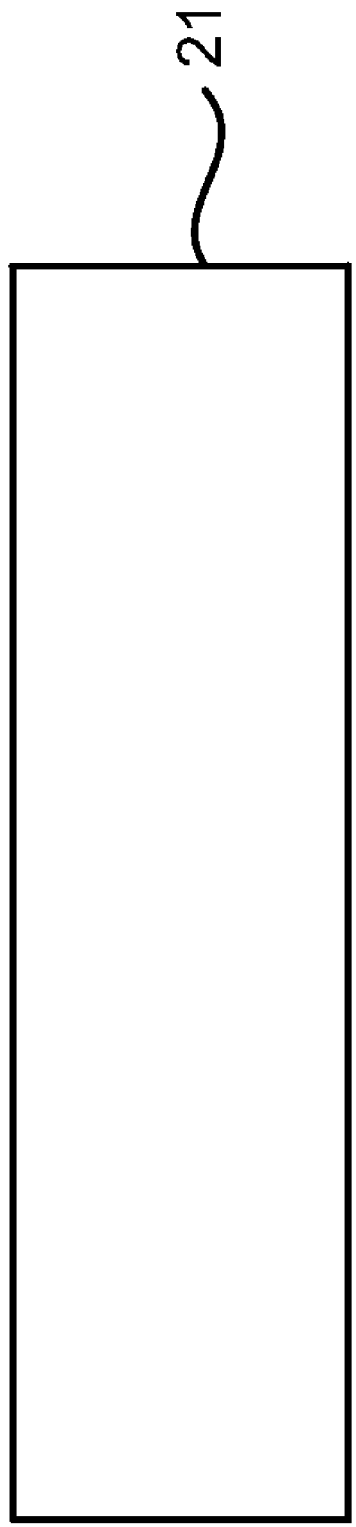
Figure 5:
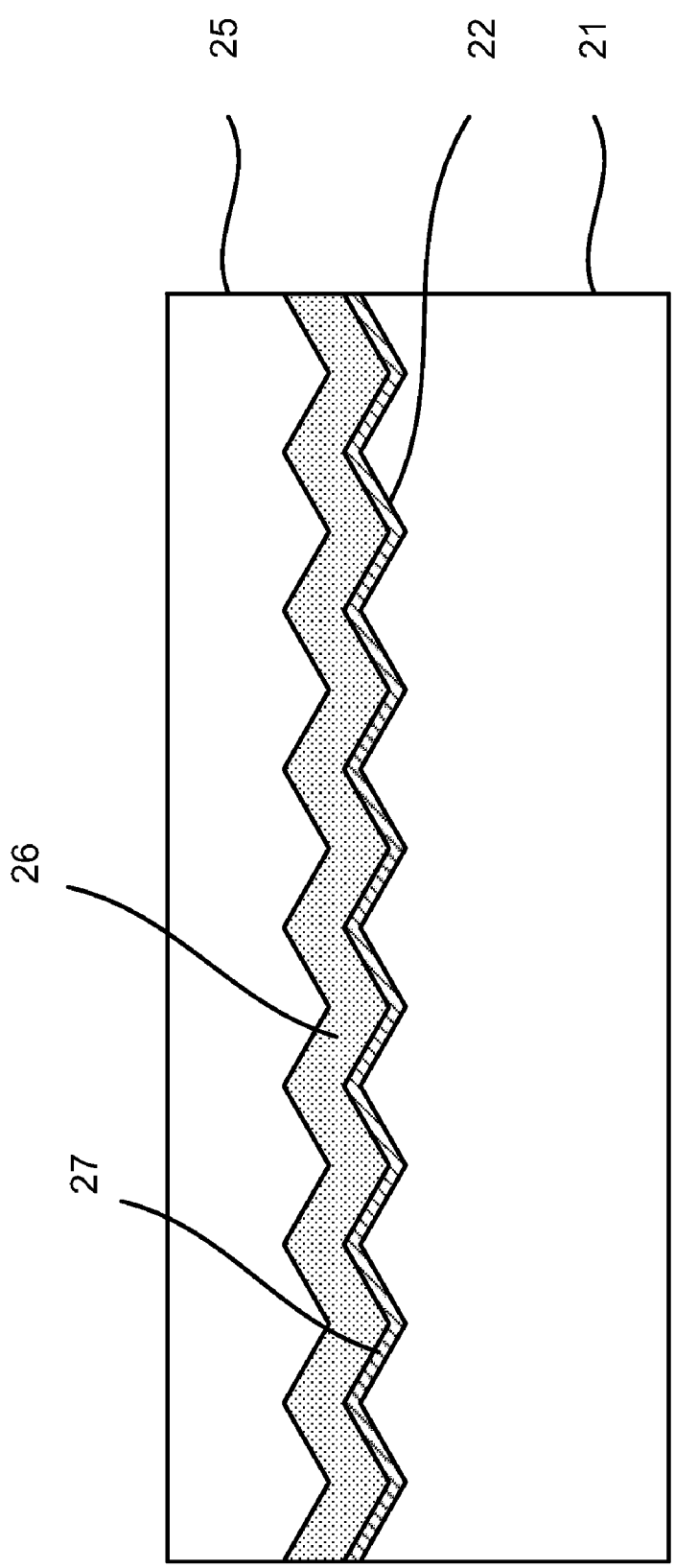

The present invention will be better understood from the following detailed description of the preferred embodiment according to the present invention, taken in conjunction with the accompanying drawings, in which FIG. 1 is the flow view showing the preferred embodiment according to the present invention; and FIG. 2 until FIG. 5 are the structural views showing the preferred embodiment.

DESCRIPTION OF THE PREFERRED EMBODIMENT

The following description of the preferred embodiment is provided to understand the features and the structures of the present invention.

Please refer to FIG. 1 until FIG. 5, which are a flow view and structural views showing the preferred embodiment according to the present invention. As shown in the figures, the present invention is a method of fabricating a thin film interface for internal light reflection and impurities isolation, comprising the following steps:

(a) Selecting substrate 11: In FIG. 2, an upgraded metallurgical grade silicon (UMG-Si) substrate 21 is selected, which has a purity ratio greater than 4N (99.99%).

Figure 3:
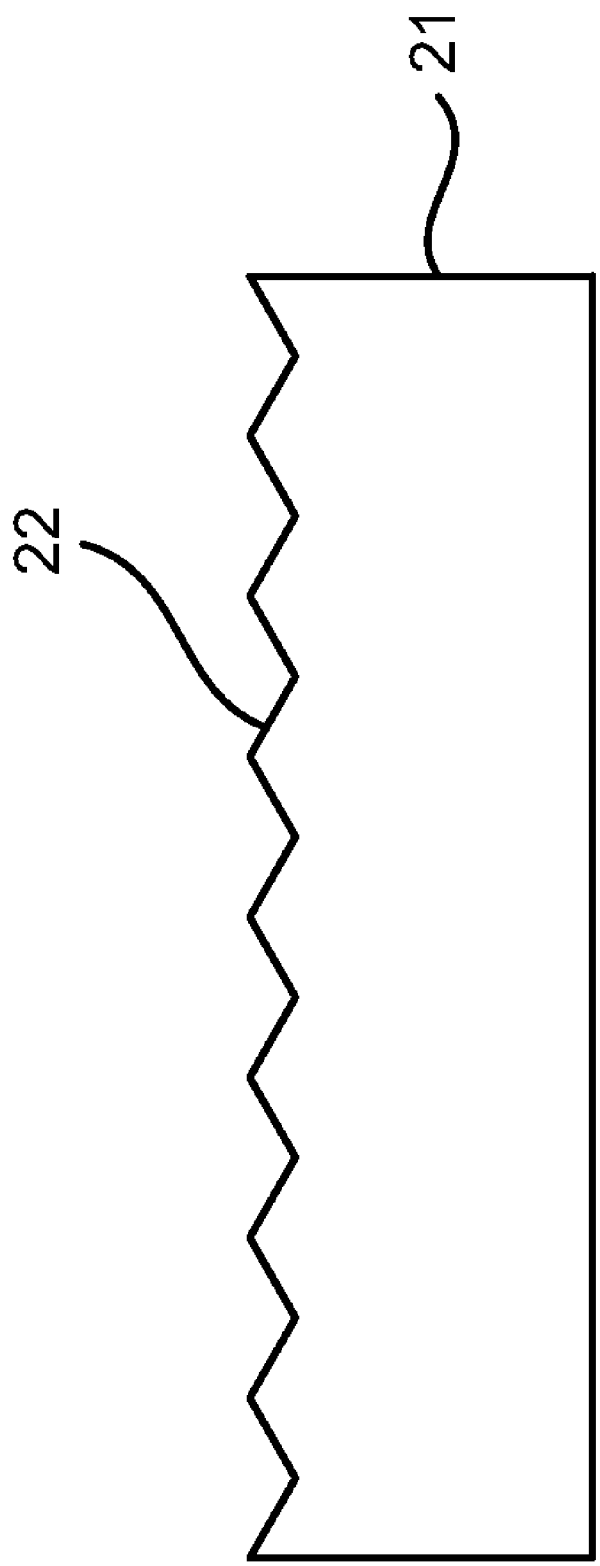

(b) Etching texturally 12: In FIG. 3, a surface textured structure 22 is formed on a surface of the UMG-Si substrate 21 through a physical method or a chemical method.

Figure 4:
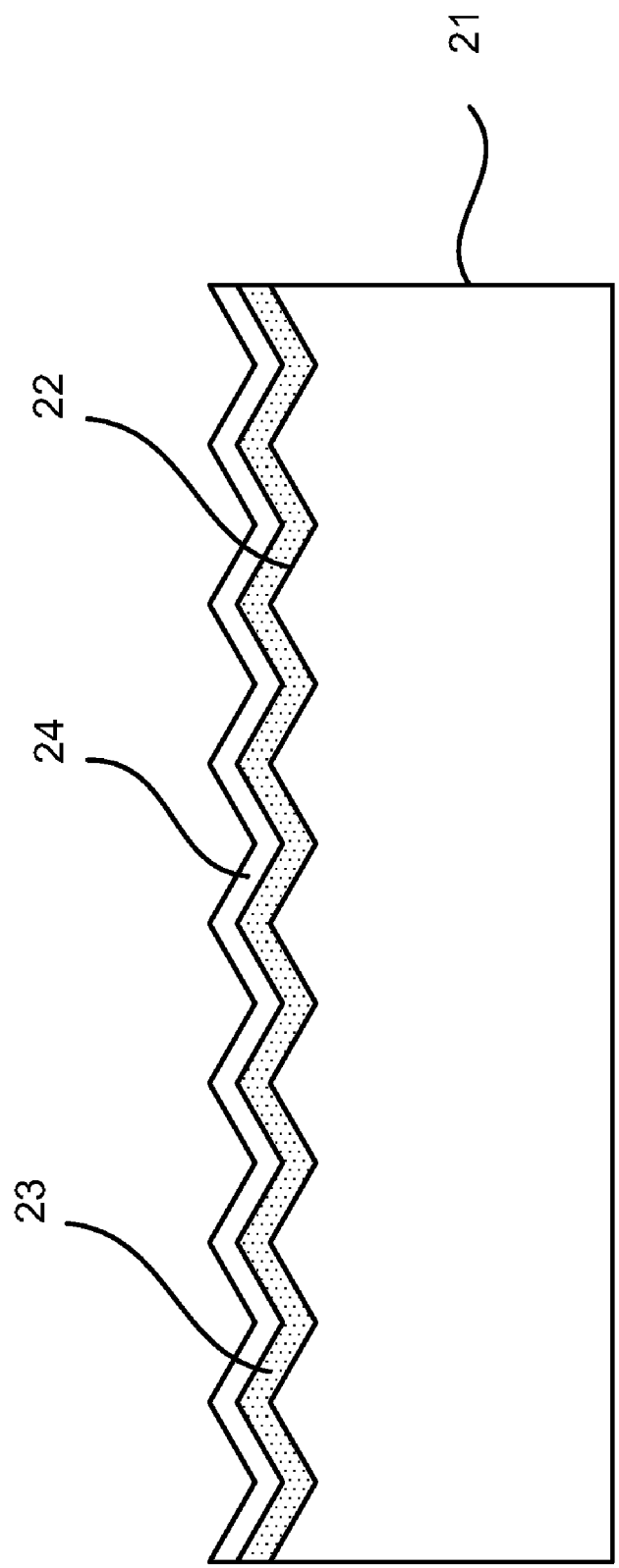

(c) Coating 13: In FIG. 4, a Ge metal thin layer 23 is coated on the surface textured structure 22 of the UMG-Si substrate 21 and an amorphous silicon (a-Si) thin layer 24 is coated on the Ge metal thin layer 23 through the physical method or the chemical method sequentially.

(d) High-temperature epitaxy 14: In FIG. 5, an epitaxy is processed through chemical vapor deposition (CVD) at a temperature between 1100° C. and 1200° C. to form a high quality epitaxial silicon layer 25 on the UMG-Si substrate 21, where a SiGe metal compound ($Si_{1-x}Ge_x$) thin film interface layer 26 is formed by the Ge metal thin layer 23 and the a-Si thin layer 24 between the UMG-Si substrate 21 and the high quality epitaxial silicon layer 25; and an impurities aggregated area 27 is thus formed at interface between the UMG-Si substrate 21 and the SiGe metal compound thin film interface layer 26.

Thus, a novel method of fabricating a thin film interface for internal light reflection and impurities isolation is obtained.

On using the present invention, a UMG-Si substrate 21 having a purity ratio greater than 4N is selected. A surface textured structure 22 is formed on a surface of the UMG-Si substrate 21 through plasma etching. Through a physical method or a chemical method, a Ge metal thin layer 23 and an a-Si thin layer 24 are coated on the surface textured structure of the UMG-Si substrate 21 sequentially. Then, an epitaxy is processed through atmospheric pressure chemical vapor deposition (APCVD) at a high temperature between 1100° C. and 1200° C. to form a high quality epitaxial silicon layer 25 on the UMG-Si substrate 21, where a SiGe metal compound thin film interface layer 26 is formed by the Ge metal thin layer 23 and the a-Si thin layer 24 between the UMG-Si substrate 21 and the high quality epitaxial silicon layer 25.

Si and SiGe metal compound are heterogeneous structures, which have mismatching crystal lattices. Hence, at interface between Si (the UMG-Si substrate 12) and SiGe metal compound (the SiGe metal compound thin film interface layer 26), an impurities aggregated area 27 is formed, which has complex network dislocation defects. These defects trap metal impurities from within the UMG-Si substrate 21 for avoid further diffusion into the high quality epitaxial silicon layer 25; and solar energy conversion efficiency is thus not declined. In addition, since Si and Ge metal compound have different refractive indexes and the surface textured structure 22 is formed on the UMG-Si substrate 21, effects of refraction and diffusion of light passing through the high quality epitaxial silicon layer 25 are enhanced and an optical path in the high quality epitaxial silicon layer is thus increased for improving solar energy conversion efficiency.

The present invention uses a substrate made of UMG-Si for forming a high quality silicon thin layer on the substrate to be used for developing an epitaxial silicon thin film solar cell. For obtaining an epitaxial silicon thin film solar cell having low cost and high efficiency, efficiency of absorbing light by the silicon thin layer has to be enhanced and diffusion of metal impurities in the substrate has to be prevented. Thus, the present invention fabricates a thin film interface between the UMG-Si substrate and the high quality epitaxial silicon layer to inhibit metal impurities in the substrate from diffusing into the high quality epitaxial silicon layer and to act as an internal reflection layer for improving photoelectrical conversion efficiency.

To sum up, the present invention is a method of fabricating a thin film interface for internal light reflection and impurities isolation, where a thin film interface is fabricated between the UMG-Si substrate and the high quality epitaxial silicon layer to inhibit metal impurities in the substrate from diffusing into the high quality epitaxial silicon layer and to act as an internal reflection layer for improving photoelectrical conversion efficiency fit for an epitaxial silicon thin film solar cell having low cost and high efficiency.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method of fabricating a thin film interface for internal light reflection and impurities isolation, comprising steps of:
   (a) obtaining an upgraded metallurgical grade silicon (UMG-Si) substrate having a purity ratio greater than 4N (99.99%);
   (b) obtaining a surface textured structure on a surface of said UMG-Si substrate through a method selected from a group consisting of a physical method and a chemical method;
   (c) coating a Ge metal thin layer directly on said surface textured structure of said UMG-Si substrate through a method and coating an amorphous silicon (a-Si) thin layer directly on said Ge metal thin layer through said method sequentially; and
   (d) processing an epitaxy through chemical vapor deposition (CVD) to obtain a high quality epitaxial silicon layer directly on said a-Si thin layer on said UMG-Si substrate,
   wherein said method in step (c) is selected from a group consisting of a physical method and a chemical method;
   wherein a SiGe metal compound ($Si_{1-x}Ge_x$) thin film interface layer is obtained by said Ge metal thin layer and said a-Si thin layer between said UMG-Si substrate and said high quality epitaxial silicon layer; and
   wherein an impurities aggregated area is obtained at an interface between said UMG-Si substrate and said SiGe metal compound thin film interface layer,
   wherein the impurities aggregated area interface between the UMG-Si substrate and the SiGe metal compound interface layer is defined by heterogeneous structures having mismatching crystal lattices.

2. The method according to claim 1, wherein, in step (b), said chemical method is plasma etching.

3. The method according to claim 1, wherein, in step (d), said CVD is atmospheric pressure chemical vapor deposition (APCVD).

4. The method according to claim 1, wherein, in step (d), said epitaxy is processed at a temperature between 1100° C. and 1200° C.

5. The method according to claim 1, wherein said SiGe metal compound thin film interface layer is an internal reflection layer to improve photoelectrical conversion efficiency.

6. The method according to claim 1, wherein said impurities aggregated area has complex network dislocation defects to trap metal impurities from within said UMG-Si substrate.

7. The method of claim 1, wherein the impurities aggregated area has complex network dislocation defects that trap metal impurities from within the UMG-Si substrate.

* * * * *